(12) United States Patent
Morand et al.

(10) Patent No.: US 8,451,067 B2
(45) Date of Patent: May 28, 2013

(54) VARIABLE MODULUS MODULATOR FOR FRACTIONAL-N FREQUENCY SYNTHESIZERS

(75) Inventors: Cedric Morand, Caen (FR); David Canard, Caen (FR)

(73) Assignee: Asahi Kasei Microdevices Corporation, Tokyo (JP)

( * ) Notice: Subject to any disclaimer, the term of this patent is extended or adjusted under 35 U.S.C. 154(b) by 54 days.

(21) Appl. No.: 13/156,051

(22) Filed: Jun. 8, 2011

(65) Prior Publication Data
US 2012/0313722 A1    Dec. 13, 2012

(51) Int. Cl.
| | | |
|---|---|---|
| H03L 7/197 | (2006.01) | |
| H03C 3/06 | (2006.01) | |
| H03M 7/32 | (2006.01) | |
| H03L 7/085 | (2006.01) | |
| H03M 7/30 | (2006.01) | |
| H03B 5/30 | (2006.01) | |

(52) U.S. Cl.
CPC . *H03L 7/085* (2013.01); *H03B 5/30* (2013.01); *H03M 7/3004* (2013.01); *H03L 7/1974* (2013.01)
USPC .............. 331/25; 327/156; 341/77; 341/143

(58) Field of Classification Search
CPC ............. H03C 2200/0083; H03B 28/00; H03B 2201/0291; H03B 2215/067
USPC .............. 327/147, 156, 105, 141, 159, 148; 341/76, 77; 335/105; 331/16
See application file for complete search history.

(56) References Cited

U.S. PATENT DOCUMENTS

| | | | |
|---|---|---|---|
| 6,927,716 B2 | 8/2005 | Keaveney et al. | |
| 8,258,835 B1* | 9/2012 | Morand et al. ................ | 327/156 |
| 2002/0114386 A1* | 8/2002 | Eklof ............................ | 375/238 |
| 2012/0013375 A1* | 1/2012 | Kuramochi ................... | 327/156 |

OTHER PUBLICATIONS

Chen et al., "*A 5.2GHz CMOS Fractional-N Frequency Synthesizer with a MASH Delta-Sigma Modulator*", Circuits and Systems, 51st Midwest Symposium, 2008, pp. 738-742.
Perrott et al., "*A 27-mW CMOS Fractional-N Synthesizer Using Digital Compensation for 2.5-Mb/s GFSK Modulation*", IEEE Journal of Solid-State Circuits, vol. 32, No. 12, 1997, pp. 2048-2060.
Riley et al., "*Delta-Sigma Modulation in Fractional-N Frequency Synthesis*", IEEE Journal of Solid-State Circuits, vol. 28, No. 5, May 1993, pp. 553-559.

* cited by examiner

*Primary Examiner* — Ryan Johnson
*Assistant Examiner* — Christian L Rivera
(74) *Attorney, Agent, or Firm* — Morgan, Lewis & Bockius LLP

(57) ABSTRACT

A variable modulus sigma delta ($\Sigma\Delta$) modulator for a fractional-N frequency synthesizer in accordance with the present invention may include an integer division unit; a pulse-width modulation (PWM) generator, a $\Sigma\Delta$ noise-shaping unit, a first input FRAC for receiving a first programmable integer, and a second input MOD for receiving a second input, wherein the integer division unit is configured to perform a translation from the first input and the second input into a first output FRAC' and a second output R, the PWM generator is configured to receive the second input MOD and the second output R, and generate a modulated pulse signal, and the $\Sigma\Delta$ noise-shaping unit is configured to receive the first output and the modulated pulse signal, and generate a sequence whose average equals approximately the first input over the second input.

20 Claims, 10 Drawing Sheets

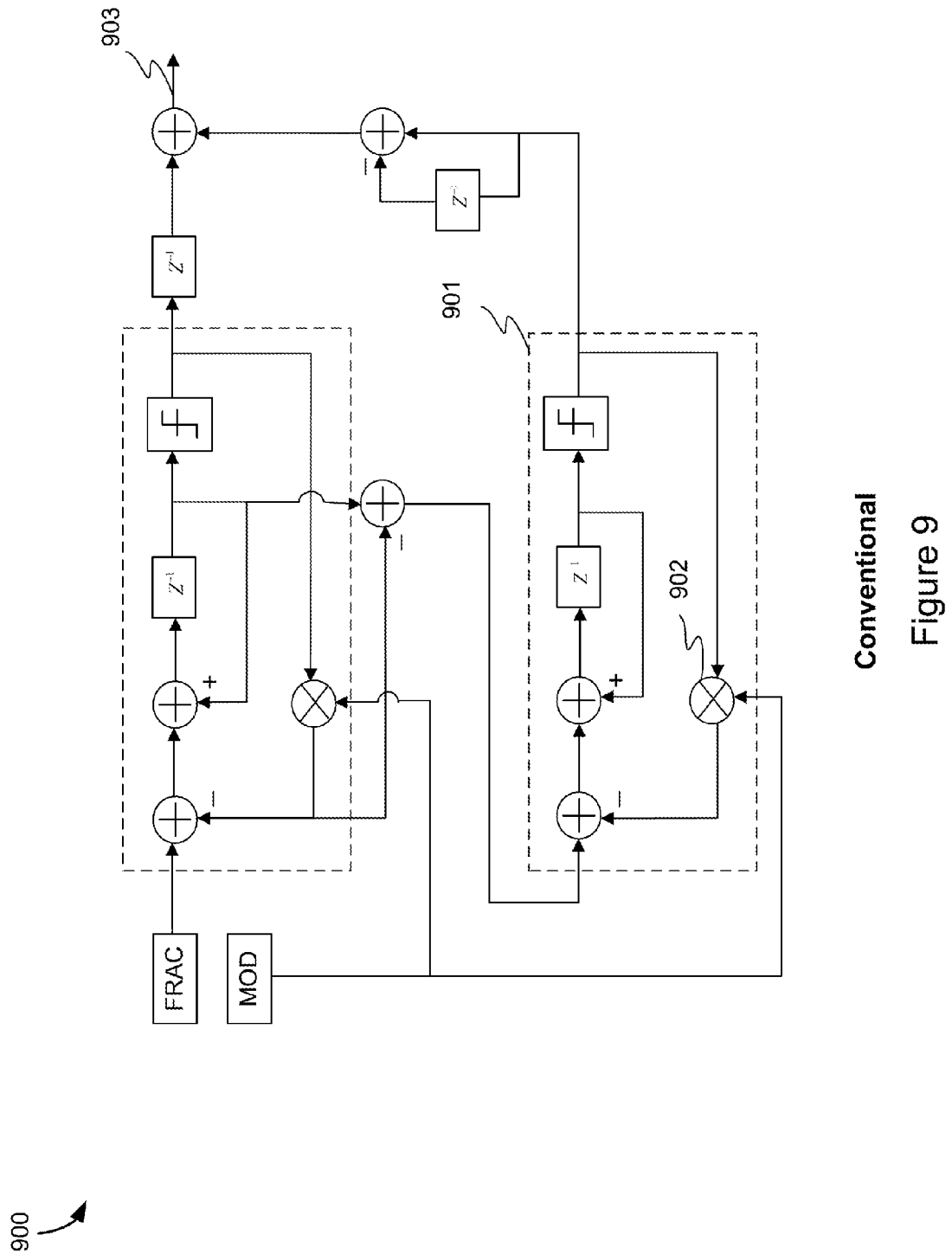
Conventional
Figure 9

VARIABLE MODULUS MODULATOR FOR FRACTIONAL-N FREQUENCY SYNTHESIZERS

FIELD OF INVENTION

The present invention relates generally to the field of a fractional-N frequency synthesizer and, in particular, to the field of a variable modulus sigma-delta (ΣΔ) modulator for a fractional-N frequency synthesizer.

BACKGROUND OF INVENTION

Current phase lock loop (PLL) based frequency synthesizers are feedback systems that may be used to create a signal with programmable frequency from a reference frequency. Such a frequency synthesizer may comprise a phase frequency detector and charge-pump for producing an error signal that signifies the proportion of any phase difference between an output signal and an input reference frequency. In addition, current frequency synthesizers may also include features for feeding the error signal into a low-pass filter and then into a voltage-controlled oscillator (VCO) such that the output signal that is produced is synchronized with the input reference frequency to the frequency synthesizer. Current frequency synthesizers may employ the negative feedback loop method of feeding the output from the VCO back into the input of the phase frequency detector such that an error signal may be generated, coupling the output signal from the VCO to the input reference frequency. In some current frequency synthesizers, the output signal may be fed into a frequency divider circuit to produce an integer multiple of the input reference frequency.

Those frequency synthesizers can only generate a frequency at an integer multiple of the input reference frequency. To circumvent such restriction, the frequency synthesizer may further include a ΣΔ modulator to modulate the value of the division per frequency cycle to obtain a fractional value. Such a frequency synthesizer is called a fractional-N frequency synthesizer. The fractional-N frequency synthesizer can generate signals whose frequency is of the form:

$$F_{vco} = F_{reference} \times \left(INT + \frac{FRAC}{MOD}\right),$$

where INT, FRAC, and MOD are integers, and $F_{VCO}$ is thus not necessarily an integer multiple of the reference frequency $F_{reference}$.

A conventional ΣΔ modulator may be configured to provide a programmable variable modulus based on a standard cascaded multi-stage noise-shaping (MASH) structure with a modification of the unit stages. FIG. 9 illustrates an exemplary illustration 900 of a $2^{nd}$ order MASH structure-based ΣΔ modulator with variable modulus, in accordance with a conventional example. In the exemplary illustration 900, on each stage of the $2^{nd}$ order MASH structure, for example, stage 901, a digital multiplier 902 is used in order to provide a programmable variable modulus output 903. However, such a ΣΔ modulator consumes more power and generates more switching noise due to a high number of gates implemented.

SUMMARY OF THE INVENTION

Accordingly, the present invention is directed to a ΣΔ modulator for a fractional-N frequency synthesizer and a method for implementing a ΣΔ modulator for a fractional-N frequency synthesizer to provide a programmable variable modulus that substantially obviates one or more problems due to limitations and disadvantages of the related art.

In an embodiment, the present invention provides a variable modulus modulator for a fractional-N frequency synthesizer comprising an integer division unit; a pulse-width modulation (PWM) generator; a ΣΔ noise-shaping unit; a first input for receiving a first programmable integer; and a second input for receiving a second programmable integer, wherein the integer division unit is configured to perform a translation from the first input and the second input into a first output and a second output, the PWM generator is configured to receive the second input and the second output, and generate a modulated pulse signal, and the ΣΔ noise-shaping unit is configured to receive the first output and the modulated pulse signal, and generate a sequence of average value of the first programmable integer over the second programmable integer.

In yet another embodiment, the translation performed by the integer division unit is determined by an integer division of the first input times $2^n$, by the second input.

In yet another embodiment, n is the bit depth of the ΣΔ noise-shaping unit.

In yet another embodiment, the first output of the integer division unit is a quotient of the performed translation, and the second output of the integer division unit is a remainder of the performed translation.

In yet another embodiment, a period of the modulated pulse signal generated by the PWM generator equals approximately a system clock period times the second input of the integer division unit.

In yet another embodiment, the duty cycle of the modulated pulse signal generated by the PWM generator equals approximately the second output of the integer division unit over the second input of the integer division unit.

In yet another embodiment, a first frequency of the PWM is determined by the second input, and a second frequency of the PWM is determined by the second output.

In a further embodiment, the present invention provides a method implementing a variable modulus modulator for a fractional-N frequency synthesizer, the method comprising the steps of receiving a first input at an integer division unit; receiving a second input at the integer division unit; translating at the integer division unit the first input and the second input into a first output and a second output; combining the second input and the second output at a pulse-width modulation (PWM) generator; generating a modulated pulse signal at the PWM generator; receiving the first output and the modulated pulse signal at a ΣΔ noise-shaping unit; and generating at the ΣΔ noise-shaping unit a sequence whose average value is the first input of the integer division unit over the second input of the integer division unit.

In yet another embodiment, the ΣΔ noise-shaping unit comprises two cascaded overflow accumulators.

In yet another embodiment, each overflow accumulator includes an adder and a register.

In a further embodiment, the present invention provides a variable modulus modulator for a fractional-N frequency synthesizer comprising a static module configured to perform a translation from a first input and a second input into a first output and a second output; and a dynamic module configured to transform the first output, the second output and the second input into a programmable variable modulus, wherein the static module is configured to perform the translation once each time a new value for one of the first input or the second input is received, or once each time new values both for the first input and the second input are received and the dynamic module is configured to perform the transformation continuously.

In yet another embodiment, the first input and the second input are programmable integers.

In yet another embodiment, the dynamic module comprises a pulse-width modulation (PWM) generator, an adder, and a ΣΔ noise-shaping unit.

In yet another embodiment, the translation performed by the static module is determined by an integer division of the first input times $2^n$, by the second input.

In yet another embodiment, a period of the modulated pulse signal generated by the PWM generator equals approximately a system clock period times the second input of the static module.

In yet another embodiment, the duty cycle of the modulated pulse signal generated by the PWM generator equals approximately the second output of the static module over the second input of the static module.

In yet another embodiment, the ΣΔ noise-shaping unit is a multi-stage noise-shaping (MASH) unit.

In yet another embodiment, the MASH unit comprises two cascaded overflow accumulators.

In yet another embodiment, each overflow accumulator includes an adder and a register.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings:

FIG. 9 illustrates a conventional example of a $2^{nd}$ order MASH structure-based ΣΔ modulator with variable modulus.

DETAILED DESCRIPTION

Reference will now be made in detail to embodiments, examples of which are illustrated in the accompanying drawings. In the following detailed description, numerous non-limiting specific details are set forth in order to assist in understanding the subject matter presented herein. It will be apparent, however, to one of ordinary skill in the art that various alternatives may be used without departing from the scope of the present invention and the subject matter may be practiced without these specific details. For example, it will be apparent to one of ordinary skill in the art that the subject matter presented herein can be implemented on any type of variable modulus ΣΔ modulator of a fractional-N frequency synthesizer.

Figure 1:
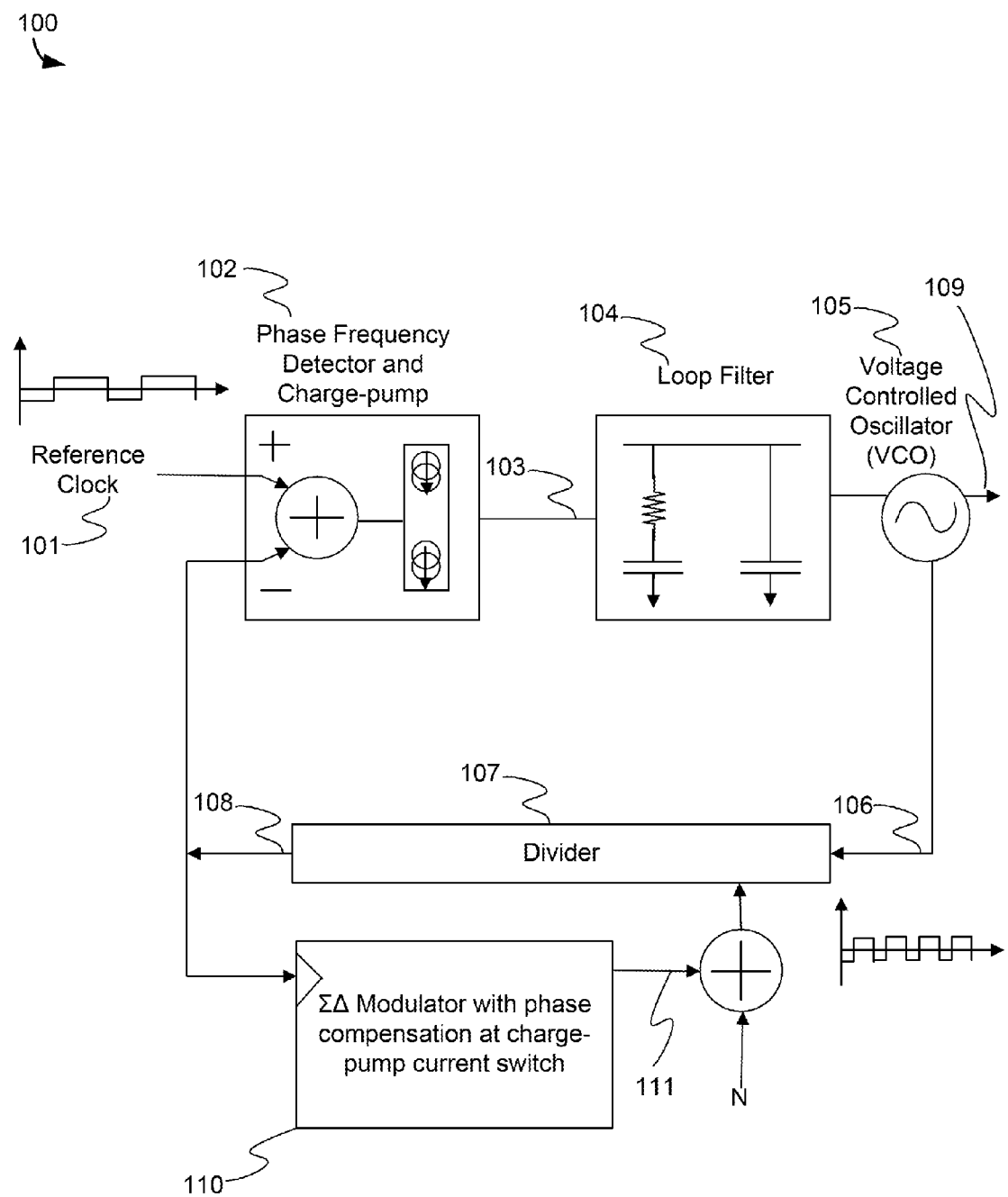
FIG. 1 illustrates an exemplary embodiment of a fractional-N frequency synthesizer having a ΣΔ modulator in accordance with the conventional invention.

FIG. 1 illustrates an exemplary embodiment 100 of a fractional-N frequency synthesizer with a loop filter 104 in series with a phase frequency detector and charge-pump 102 in accordance with the present invention. In the exemplary embodiment 100, a reference clock signal 101 may be an input to the phase frequency detector and charge-pump 102 along with the output divided VCO signal 108 from a divider 107. The phase frequency detector and charge-pump 102 may detect the phase difference between the reference clock signal 101 and the output divided VCO signal 108 and convert it into an error output signal 103. The error output signal 103 from the phase frequency detector and charge-pump 102 may be integrated by the loop filter 104 to generate a tuning voltage input to the VCO 105. The loop filter 104 is generally a passive circuit. The loop filter 104 may improve the spectral purity of the VCO output signal 109 by filtering the charge pump 102 current pulses. A first output signal 109 from the VCO 105 may be used as the input, for example, to a device connected to the VCO 105. A second output signal 106 from the VCO 105 may be used to create a negative feedback loop circuit through the divider 107 for use as an input to the phase frequency detector and charge-pump 102.

In some embodiments, the dividing ratio of the divider 107 may be modulated from cycle to cycle by the output signal from a sigma delta (ΣΔ) modulator 110. The ΣΔ modulator 110 may use the divided VCO signal 108 as its clock input signal. The digital signal 111 generated by the ΣΔ modulator 110 may be added to a predetermined integer N and fed to the dividing ratio control input of the divider 107. As a result, the average dividing ratio of the divider may not be an integer number and the frequency of the VCO output signal 109 may not necessarily be an integer multiple of the reference frequency 101.

From the configuration of the phase frequency detector and charge-pump 102, the loop filter 104 and the voltage controlled oscillator as illustrated in FIG. 1, the frequency of the VCO output signal 109 $f_{VCO}$ may be derived as $$F_{vco} = \left(N + \frac{FRAC}{MOD}\right) \times f_{reference},$$

where N, FRAC, and MOD are integers, and $f_{reference}$ is the reference lock frequency 101. However, $f_{VCO}$ is not necessarily an integer multiple of the reference lock frequency $f_{reference}$.

Figure 2:
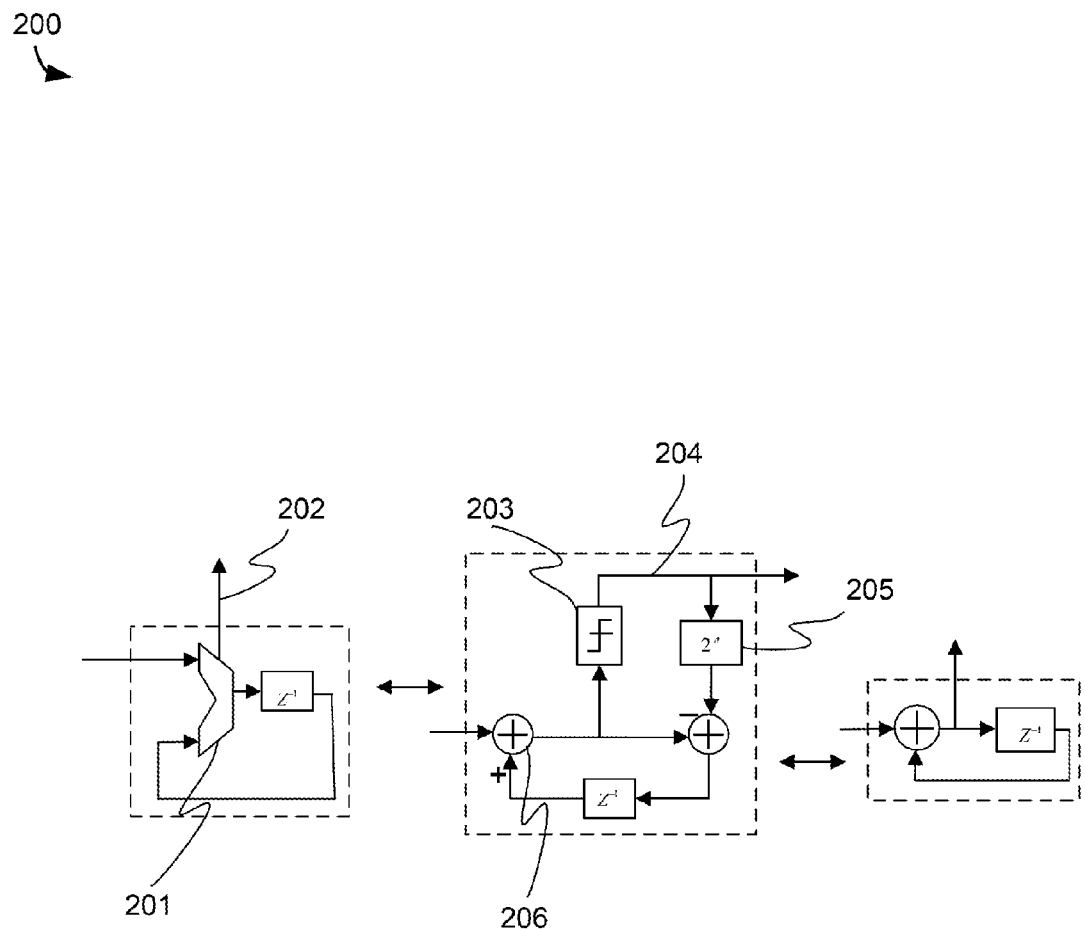
FIG. 2 illustrates an exemplary embodiment of an accumulator with natural overflow to $2^n$ as used in a ΣΔ modulator in accordance with the present invention.

FIG. 2 illustrates an exemplary embodiment 200 of one accumulator stage in a ΣΔ modulator of a fractional-N frequency synthesizer. In the exemplary embodiment 200, one accumulator stage of the MASH unit in the ΣΔ modulator 110 may be based on a full adder 201 with carry output 202. The natural overflow at $2^n$ on the adder 201 may be equivalent to a quantizer 203, whose output 204 is the carry output 202 of the full adder 201. The output 204 of the quantizer 203 may be fed into an implicit multiplier 205 by $2^n$. The output of the quantizer 203 is then subtracted from the output of a second adder 206. The exemplary embodiment 200 of one accumulator stage of the MASH unit in the ΣΔ modulator 110 may be configured with a fixed modulus value $2^n$ because the multiplier 205 may not be programmed with a variable value.

Figure 3:
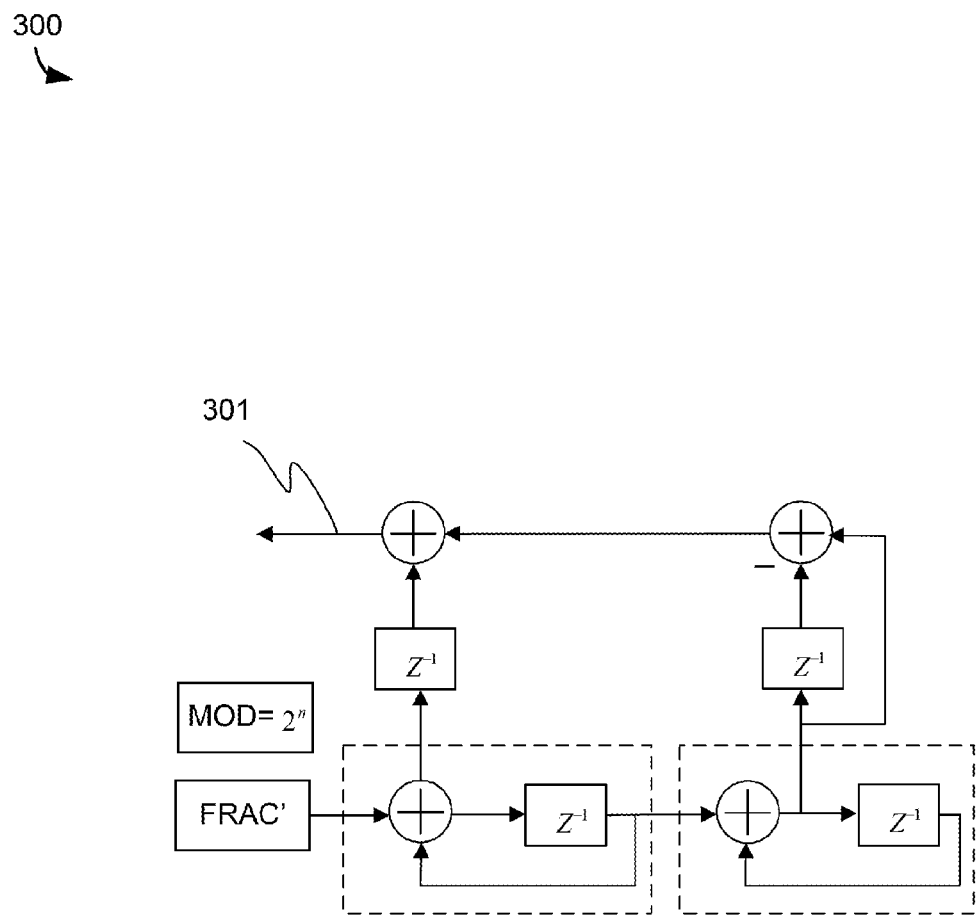
FIG. 3 illustrates an exemplary embodiment of a $2^{nd}$ order MASH structure-based ΣΔ modulator with MOD=$2^n$, in accordance with the present invention.

FIG. 3 illustrates an exemplary embodiment 300 of a $2^{nd}$ order MASH structure-based ΣΔ modulator with MOD=$2^n$. In the exemplary embodiment 300, the average value of the output signal 301 of the $2^{nd}$ order MASH structure-based ΣΔ modulator may be $$\frac{FRAC'}{2^n}.$$

In some embodiment, the present invention employs a standard $2^{nd}$ order MASH structure-based ΣΔ modulator with a translation system to achieve both power consumption efficiency and programmable modulus operation.

To obtain a programmable modulus, we need the following condition:

$$\frac{FRAC'}{2^n} = \frac{FRAC}{MOD}$$

Re-arranging the above condition, we obtain $$FRAC' = \frac{2^n \times FRAC}{MOD},$$

where FRAC' is the quotient of the real division of ($2^n$× FRAC) by MOD.

However, depending on the values of FRAC and MOD, the quotient FRAC' is not necessarily an integer. Accordingly, applying an integer division (÷), we obtain $$FRAC' = (2^n \times FRAC) \div MOD + \frac{R}{MOD},$$

where $R = (2^n \times FRAC)$ modulo $MOD$.

The division expression of FRAC' may be exact by taking the remainder R of the division into consideration.

Figure 4:
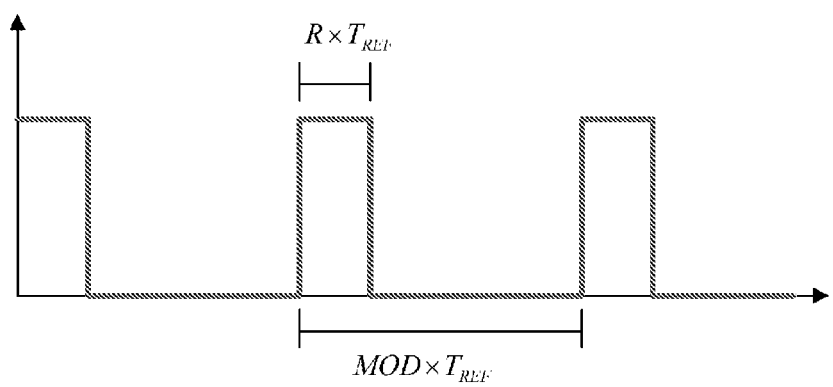
FIG. 4 illustrates an exemplary illustration of a remainder sequence generated by a PWM generator in accordance with the present invention.

FIG. 4 illustrates an exemplary illustration 400 of a remainder sequence generated by a PWM generator in accordance with the present invention. In the exemplary illustration 400, the remainder R may be added to FRAC' through a single-bit sequence with duty cycle R/MOD.

Figure 5:
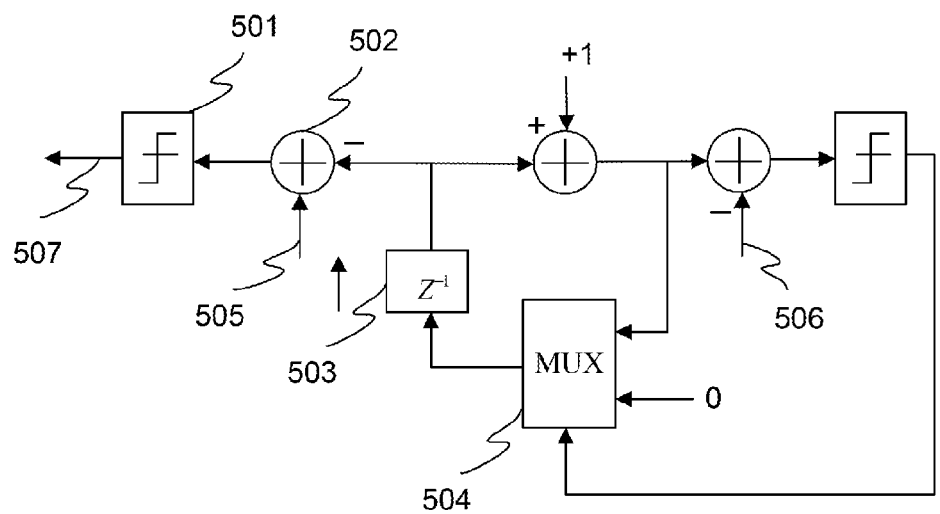
FIG. 5 illustrates an exemplary illustration of a PWM generator in accordance with the present invention.

FIG. 5 illustrates an exemplary illustration 500 of a PWM generator to generate a remainder sequence in some embodiment. The exemplary embodiment 500 comprises at least one single-bit quantizer 501 with a threshold value of zero, one adder 502, one delay unit 503, and one multiplexer 504. The remainder R of the division may be received at the input 505, and the MOD value may be received at the input 506. A single-bit sequence with duty cycle R/MOD may be generated at the output 507. In the exemplary illustration 500, the spectral power of the PWM remainder sequence may be attenuated by $2^n$, relative to the standard MASH sequence, as the sequence may amount to less than 1 LSB (Least Significant Bit). Consequently, applying the PWM generator may have no negative effect on the overall phase-noise performance.

Figure 6:
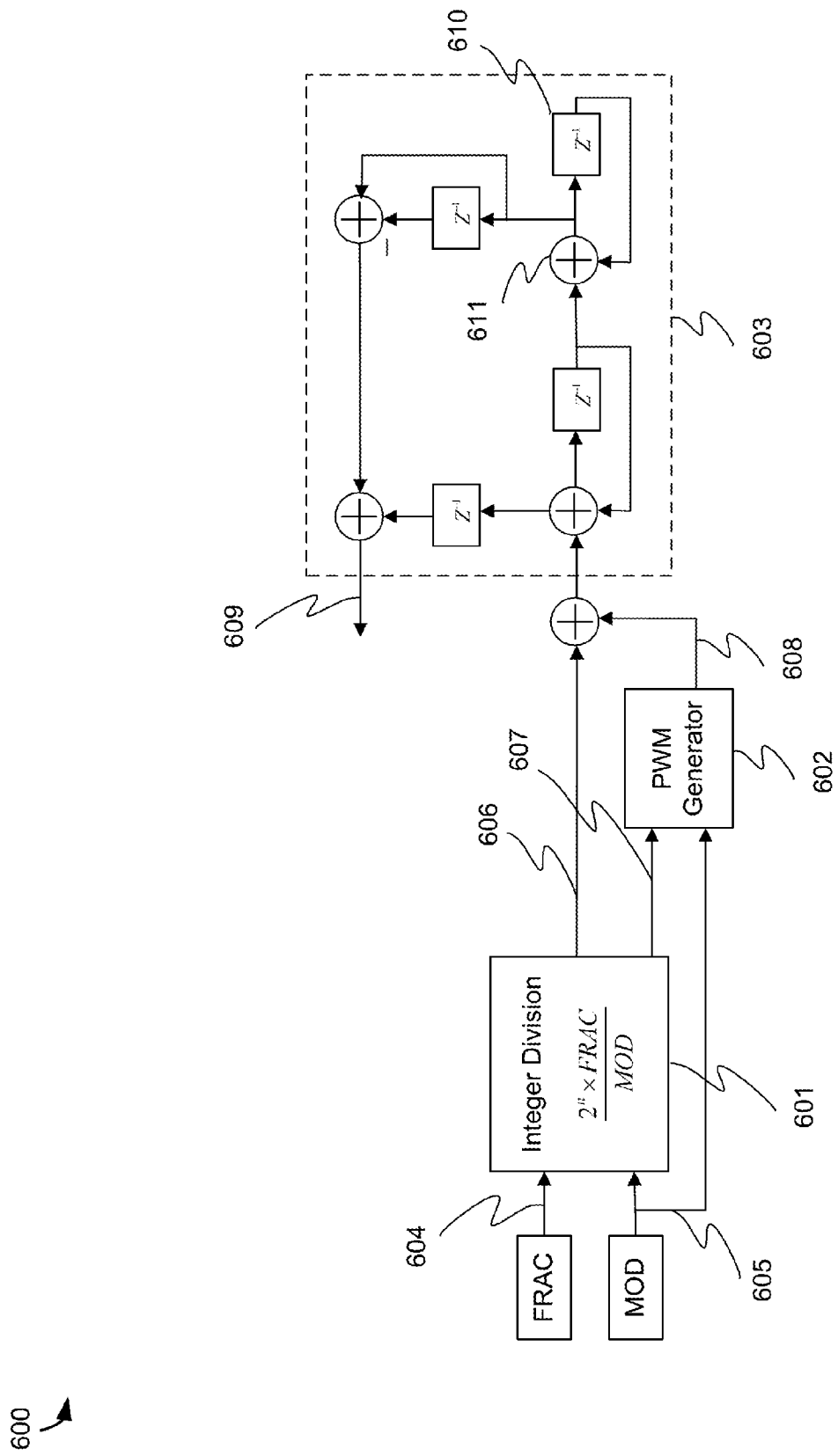
FIG. 6 illustrates an exemplary embodiment of a variable modulus ΣΔ modulator of a fractional-N frequency synthesizer in accordance with the present invention.

FIG. 6 illustrates an exemplary embodiment 600 of a variable modulus ΣΔ modulator of a fractional-N frequency synthesizer in accordance with the present invention. In the exemplary embodiment 600, a variable modulus ΣΔ modulator of a fractional-N frequency synthesizer may comprise an integer division unit 601, a PWM generator 602, a MASH unit 603, a first input 604 for receiving a first programmable integer, and a second input 605 for receiving a second programmable integer. The integer division unit 601 may be configured to perform a translation from the first input 604 and the second input 605 into a first output 606 and the second output 607. The PWM generator 602 may be configured to receive the second input 605 and the second output 607, and further generate a modulated pulse signal 608. The first output 606 may be added to the modulated pulse signal 608, and further received at the MASH unit 603 as an input. The MASH unit may further be configured to generate a sequence of average value the first input 604 over the second input 605, at the output 609.

In some embodiment, the MASH unit 603 may further comprise two or more cascaded overflow accumulators, wherein each overflow accumulator includes at least an adder and a register, for example, register 610 and adder 611.

In some embodiment, the translation performed by the integer division unit 601 may be determined by an integer division of the first input 604 times $2^n$, where n is the bit depth of the MASH unit, by the second input 605.

In some embodiment, the first output 606 of the integer division unit 601 may be a quotient of the performed translation, and the second output 607 of the integer division unit 601 may be a remainder of the performed translation.

In yet another embodiment, the period of the modulated pulse signal 608 generated by the PWM generator 602 may equal the system clock period times the second input of the integer division unit, while its duty cycle may equal the second output of the integer division unit 607 over the second input of the integer division unit 605.

In the exemplary embodiment 600, the integer division unit 601 may only operate once each time a new FRAC value or a new MOD value is needed as the first input 604 of the integer division unit 601. Consequently, in some embodiments of the present invention, the continuous operation of the ΣΔ modulator may be greatly reduced. Thus, some embodiments of the present invention may provide lower power consumption and switching noise, as compared to a conventional ΣΔ modulator.

Figure 7:
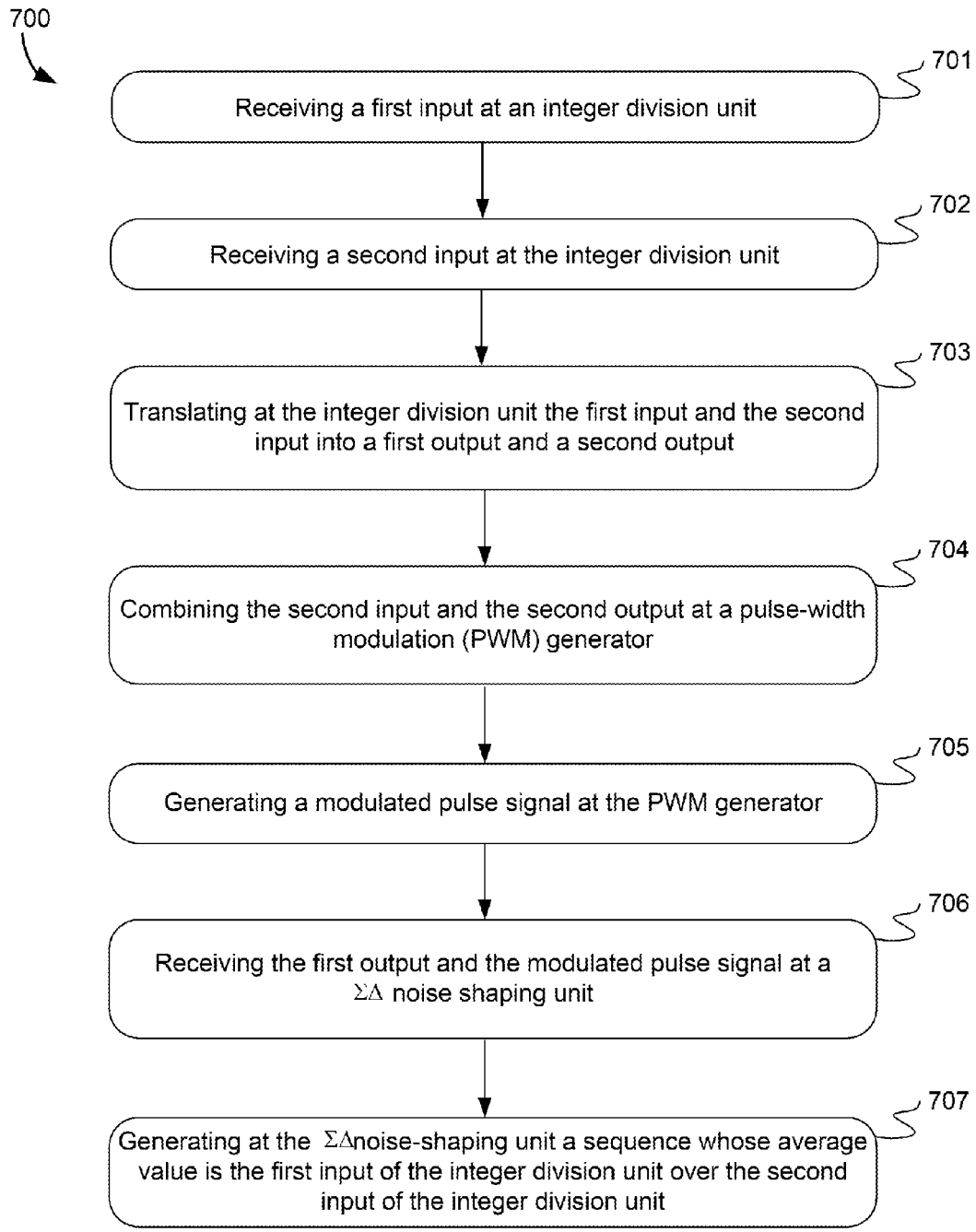
FIG. 7 illustrates exemplary method steps for implementing a variable modulus ΣΔ modulator for a fractional-N frequency synthesizer, in accordance with the present invention.

FIG. 7 illustrates exemplary method steps for implementing a variable modulus ΣΔ modulator for a fractional-N frequency synthesizer, in accordance with the present invention. The exemplary method steps for implementing a variable modulus ΣΔ modulator include receiving a first input at an integer division unit 701, receiving a second input at the integer division unit 702, translating at the integer division unit the first input and the second input into a first output and a second output 703, combining the second input and the second output at a pulse-width modulation (PWM) generator 704, generating a modulated pulse signal at the PWM generator 705, receiving the first output and the modulated pulse signal at a multi-stage noise-shaping (MASH) unit 706, and generating a sequence of average value of the first input over the second input at the MASH unit 707.

Figure 8:
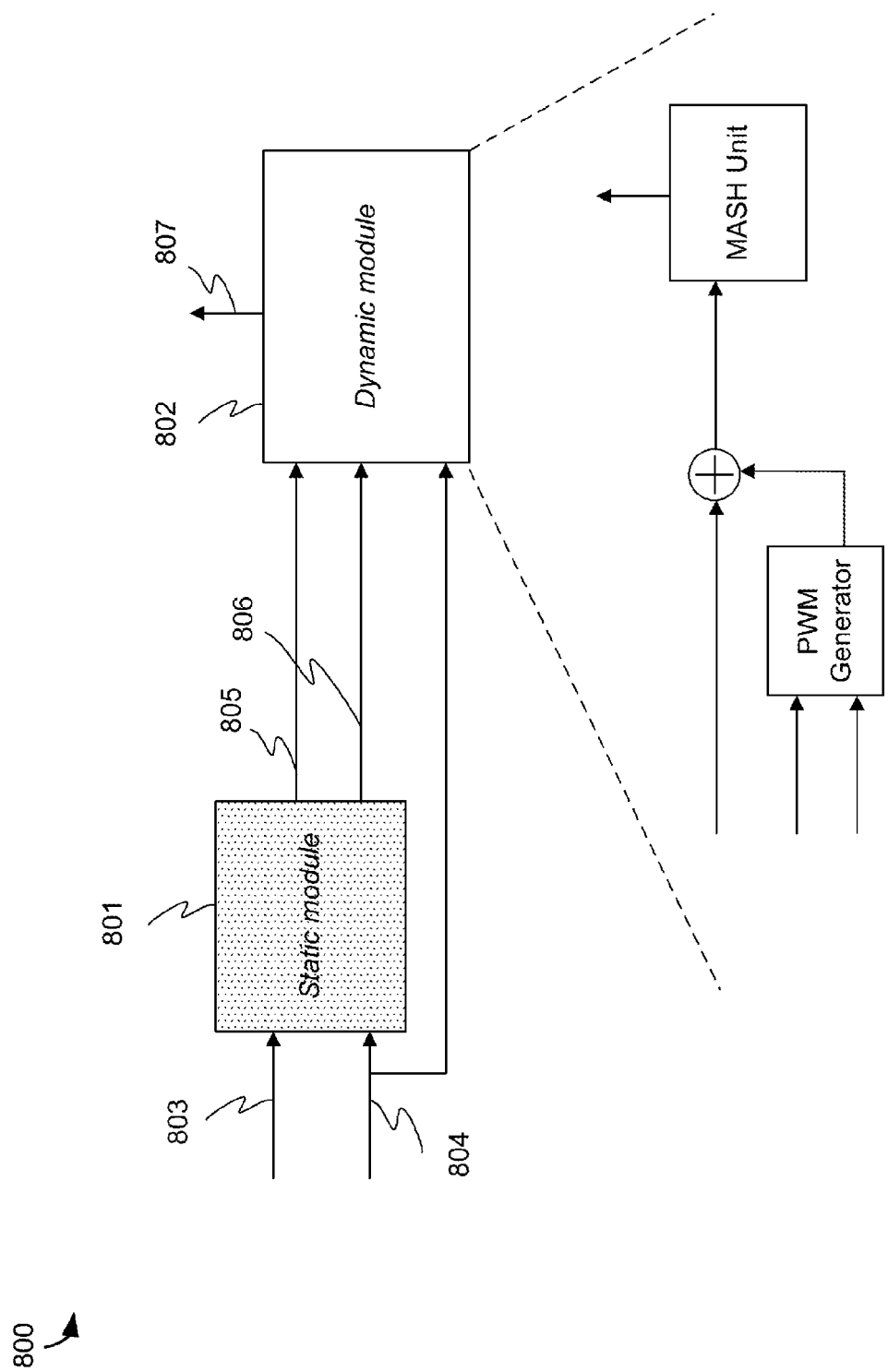
FIG. 8 illustrates another exemplary embodiment of a variable modulus ΣΔ modulator of a fractional-N frequency synthesizer in accordance with the present invention.

FIG. 8 illustrates another exemplary embodiment 800 of a variable modulus ΣΔ modulator of a fractional-N frequency synthesizer in accordance with the present invention. In the exemplary embodiment 800, a variable modulus sigma delta (ΣΔ) modulator for a fractional-N frequency synthesizer may comprise a static module 801 configured to perform a translation from a first input 803 and a second input 804 into a first output 805 and a second output 806; and a dynamic module 802 configured to transform the first output 805, the second output 806 and the second input 804 into a sequence of average value of the first input 803 over the second input 804 at output 807, in which the first output 805, the second output 806 and the second input 804 are received at the dynamic module 802 as inputs, and the signal 807 is generated at the dynamic module 802 as output. In some embodiment, the static module 801 may be configured to perform the translation once each time a new value of the first input 803 or second input 804 is received, and the dynamic module 802 may be configured to perform the transformation continuously. Further, the first input 803 and the second input 804 may be programmable integers, and the translation performed by the static module may be determined by an integer division of the first input 803 times $2^n$, where n is the bit depth of the MASH unit in the dynamic module 802, by the second input 804. In some embodiment, the dynamic module 802 may further comprise a pulse-width modulation (PWM) generator and a multi-stage noise-shaping (MASH) unit.

FIG. 9 illustrates a conventional example 900 of a $2^{nd}$ order MASH structure-based ΣΔ modulator with variable modulus.

Figure 10:
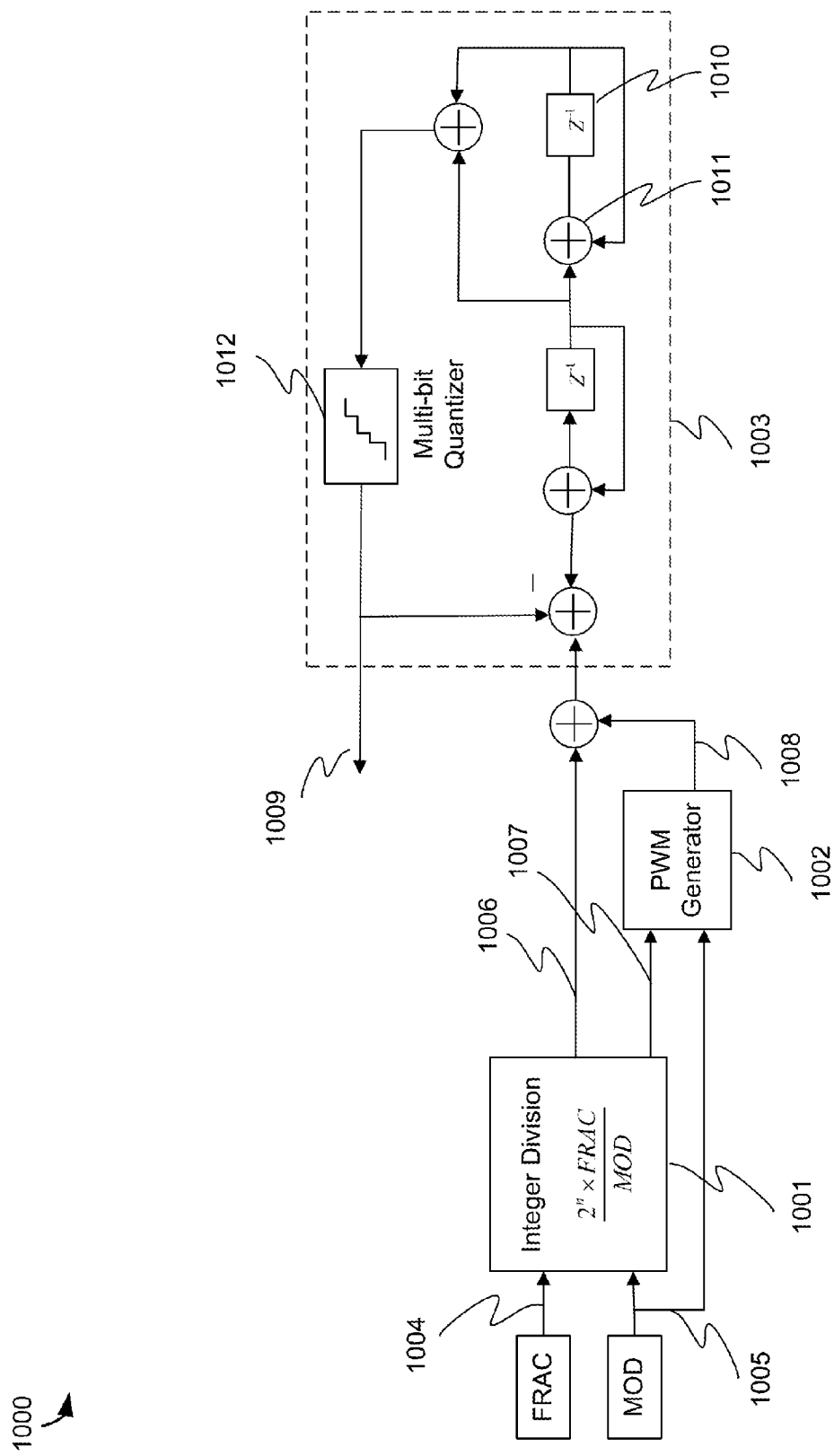
FIG. 10 illustrates an exemplary embodiment of a variable modulus ΣΔ modulator of a fractional-N frequency synthesizer in accordance with the present invention implementing a single-stage (loop) ΣΔ noise-shaping unit.

FIG. 10 illustrates an exemplary embodiment of a variable modulus ΣΔ modulator of a fractional-N frequency synthesizer in accordance with the present invention implementing a single-stage (loop) ΣΔ noise-shaping unit (contrast with the multi-stage noise-shaping unit (MASH) shown in FIG. 6).

In some embodiments, the variable modulus modulator for a fractional-N frequency synthesizer is not limited to having a multi-stage noise-shaping unit (MASH). FIG. 10 is an exemplary embodiment comprising a single-stage (loop) ΣΔ $2^{nd}$ order modulator, also known as a ΣΔ noise-shaping unit, including a single-stage (loop) ΣΔ noise-shaping unit 1003 with an adder 1011, a delay unit 1010, and a multi-bit quantizer 1012. The output of a noise-shaping unit 1009 may be applied to a fractional-N synthesizer in a similar manner as the output 609 in FIG. 6. In some embodiments, the translation from FRAC 1004 and MOD 1005 into the first output 1006 and the second output 1007 by use of the integer division unit 1001, and further into the modulated pulse signal 1008 by use of the PWM generator 1002, may operate in a similar manner to what is described, above, for FIG. 6. In some embodiments, any type of ΣΔ modulator may be used as a noise-shaping unit.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. A variable modulus modulator for a fractional-N frequency synthesizer comprising:
an integer division unit;
a pulse-width modulation (PWM) generator;
a ΣΔ noise-shaping unit;
a first input for receiving a first programmable integer; and
a second input for receiving a second programmable integer,
wherein the integer division unit is configured to perform a translation from the first input and the second input into a first output and a second output, the PWM generator is configured to receive the second input and the second output, and generate a modulated pulse signal, and the ΣΔ noise-shaping unit is configured to receive the first output and the modulated pulse signal, and generate a sequence of average value of the first programmable integer over the second programmable integer.

2. The variable modulus modulator for a fractional-N frequency synthesizer of claim 1, wherein the translation performed by the integer division unit is determined by an integer division of the first input times $2^n$, by the second input, where n is an integer.

3. The variable modulus modulator for a fractional-N frequency synthesizer of claim 2, where n is the size of the input data bus of the ΣΔ noise-shaping unit.

4. The variable modulus modulator for a fractional-N frequency synthesizer of claim 2, wherein the first output of the integer division unit is a quotient of the performed translation, and the second output of the integer division unit is a remainder of the performed translation.

5. The variable modulus modulator for a fractional-N frequency synthesizer of any one of claims 1, 2, 3, or 4, wherein a period of the modulated pulse signal generated by the PWM generator equals approximately a system clock period times the second input of the integer division unit.

6. The variable modulus modulator for a fractional-N frequency synthesizer of any one of claims 1, 2, 3, or 4, wherein the duty cycle of the modulated pulse signal generated by the PWM generator equals approximately the second output of the integer division unit over the second input of the integer division unit.

7. The variable modulus modulator for a fractional-N frequency synthesizer of claims 1, 2, 3, or 4, wherein a first frequency of the PWM is determined by the second input, and a second frequency of the PWM is determined by the second output.

8. A method implementing a variable modulus modulator for a fractional-N frequency synthesizer, the method comprising the steps of:
receiving a first input at an integer division unit;
receiving a second input at the integer division unit;
translating at the integer division unit the first input and the second input into a first output and a second output;
combining the second input and the second output at a pulse-width modulation (PWM) generator;
generating a modulated pulse signal at the PWM generator;
receiving the first output and the modulated pulse signal at a ΣΔ noise-shaping unit; and
generating at the ΣΔ noise-shaping unit a sequence whose average value is the first input of the integer division unit over the second input of the integer division unit.

9. The method of claim 8, wherein the translating performed at the integer division unit is determined by an integer division of the first input times $2^n$, by the second input, where n is an integer.

10. The method of claim 9, where n is the size of the input data bus of the ΣΔ noise-shaping unit.

11. The method of claim 9, wherein the first output of the integer division unit is a quotient of the translating, and the second output of the integer division unit is a remainder of the translating.

12. The method of any one of claims 8, 9, 10, or 11, wherein the period of the modulated pulse signal generated by the PWM generator equals approximately a system clock period times the second input of the integer division unit.

13. The method of any one of claims 8, 9, 10, or 11, wherein a duty cycle of the modulated pulse signal generated by the PWM generator equals approximately the second output of the integer division unit over the second input of the integer division unit.

14. The method of any one of claims 8, 9, 10, or 11, wherein a first frequency of the PWM is determined by the second input, and a second frequency of the PWM is determined by the second output.

15. The variable modulus modulator for a fractional-N frequency synthesizer of any one of claims 1, 2, or 3 comprising:
   a static module configured to perform a translation from a first input and a second input into a first output and a second output; and
   a dynamic module configured to transform the first output, the second output and the second input into a programmable variable modulus,
   wherein the static module is configured to perform the translation once each time a new value for one of the first input or the second input is received, or once each time new values both for the first input and the second input are received and the dynamic module is configured to perform the transformation continuously.

16. The variable modulus modulator for a fractional-N frequency synthesizer of any one of claims 1, 2, or 3 wherein the ΣΔ noise-shaping unit is a multi-stage noise-shaping (MASH) unit.

17. The variable modulus modulator for a fractional-N frequency synthesizer of claim 16, wherein the MASH unit comprises two cascaded overflow accumulators.

18. The variable modulus modulator for a fractional-N frequency synthesizer of claim 17, wherein each overflow accumulator includes an adder and a register.

19. The method implementing a variable modulus modulator for a fractional-N frequency synthesizer of any one of claims 8, 9, 10, or 11 comprising the steps of:
   a static module configured to perform a translation from a first input and a second input into a first output and a second output; and
   a dynamic module configured to transform the first output, the second output and the second input into a programmable variable modulus,
   wherein the static module is configured to perform the translation once each time a new value for one of the first input or the second input is received, or once each time new values both for the first input and the second input are received and the dynamic module is configured to perform the transformation continuously.

20. The method implementing a variable modulus modulator for a fractional-N frequency synthesizer of claims 8, 9, 10, or 11 wherein the ΣΔ noise-shaping unit is a multi-stage noise-shaping (MASH) unit.

* * * * *